US009059212B2

(12) United States Patent
Haensch et al.

(10) Patent No.: US 9,059,212 B2
(45) Date of Patent: Jun. 16, 2015

(54) BACK-END TRANSISTORS WITH HIGHLY DOPED LOW-TEMPERATURE CONTACTS

(71) Applicant: INTERNATIONAL BUSINESS MACHINES CORPORATION, Armonk, NY (US)

(72) Inventors: Wilfried E. Haensch, Somers, NY (US); Bahman Hekmatshoar-Tabari, White Plains, NY (US); Ali Khakifirooz, Mountain View, CA (US); Tak H. Ning, Yorktown Heights, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 155 days.

(21) Appl. No.: 13/665,140

(22) Filed: Oct. 31, 2012

(65) Prior Publication Data
US 2014/0120666 A1    May 1, 2014

(51) Int. Cl.
| H01L 21/336 | (2006.01) |
| H01L 29/66 | (2006.01) |
| H01L 29/78 | (2006.01) |
| H01L 21/8238 | (2006.01) |
| H01L 21/84 | (2006.01) |

(52) U.S. Cl.
CPC .... *H01L 29/66628* (2013.01); *H01L 29/66636* (2013.01); *H01L 29/66772* (2013.01); *H01L 29/78* (2013.01); *H01L 21/823814* (2013.01); *H01L 21/84* (2013.01); *H01L 29/7834* (2013.01)

(58) Field of Classification Search
CPC ............ H01L 21/84; H01L 21/823814; H01L 29/66772; H01L 29/78; H01L 29/66628; H01L 29/66636; H01L 29/7848
USPC .......... 438/151, 164, 149, 300; 257/E21.415, 257/E21.43
See application file for complete search history.

(56) References Cited

U.S. PATENT DOCUMENTS

| 6,905,920 B2 * | 6/2005 | Higashi et al. ................ 438/197 |
| 6,946,371 B2 | 9/2005 | Langdo et al. |
| 7,009,258 B2 | 3/2006 | Park et al. |

(Continued)

OTHER PUBLICATIONS

Liu, J., et al. "Nickel Germanosilicide Contacts Formed on Heavily Boron Doped SI1-XGEX Source/Drain Junctions for Nanoscale CMOS" IEEE Transactions on Electron Devices, Vol. 52, No. 7. Jul. 2005. pp. 1535-1540.

(Continued)

*Primary Examiner* — Michael Trinh
(74) *Attorney, Agent, or Firm* — Tutunjian & Bitetto, P.C.; Louis J. Percello

(57) ABSTRACT

A back end of line device and method for fabricating a transistor device include a substrate having an insulating layer formed thereon and a channel layer formed on the insulating layer. A gate structure is formed on the channel layer. Dopants are implanted into an upper portion of the channel layer on opposite sides of the gate structure to form shallow source and drain regions using a low temperature implantation process. An epitaxial layer is selectively grown on the shallow source and drain regions to form raised regions above the channel layer and against the gate structure using a low temperature plasma enhanced chemical vapor deposition process, wherein low temperature is less than about 400 degrees Celsius.

9 Claims, 6 Drawing Sheets

(56) References Cited

U.S. PATENT DOCUMENTS

| | | |
|---|---|---|
| 7,423,323 B2 | 9/2008 | Chen et al. |
| 7,737,007 B2 | 6/2010 | Samoilov et al. |
| 7,960,256 B2 | 6/2011 | Ye et al. |
| 2009/0087967 A1 | 4/2009 | Todd |
| 2010/0038715 A1* | 2/2010 | Babich et al. ............... 257/347 |
| 2011/0037125 A1 | 2/2011 | Cheng et al. |
| 2011/0042744 A1 | 2/2011 | Cheng et al. |
| 2012/0210932 A1* | 8/2012 | Hekmatshoar-Tabari et al. ............... 117/103 |

OTHER PUBLICATIONS

Sedgwick, T.O., et al. "Selective Sige and Heavily As Doped SI Deposited At Low Temperature by Atmospheric Pressure Chemical Vapor Deposition" 11 J. Vac. Sci. Tech. B. Jun. 1993. pp. 1124-1128.

Uchino, T., et al. "A Raised Source/Drain Technology Using In-Situ P-Doped Sige and B-Doped SI for 0.1-UM CMOS ULSIS" IEEE International Electron Device Meeting Technical Digest. Dec. 1997. pp. 1-4.

\* cited by examiner

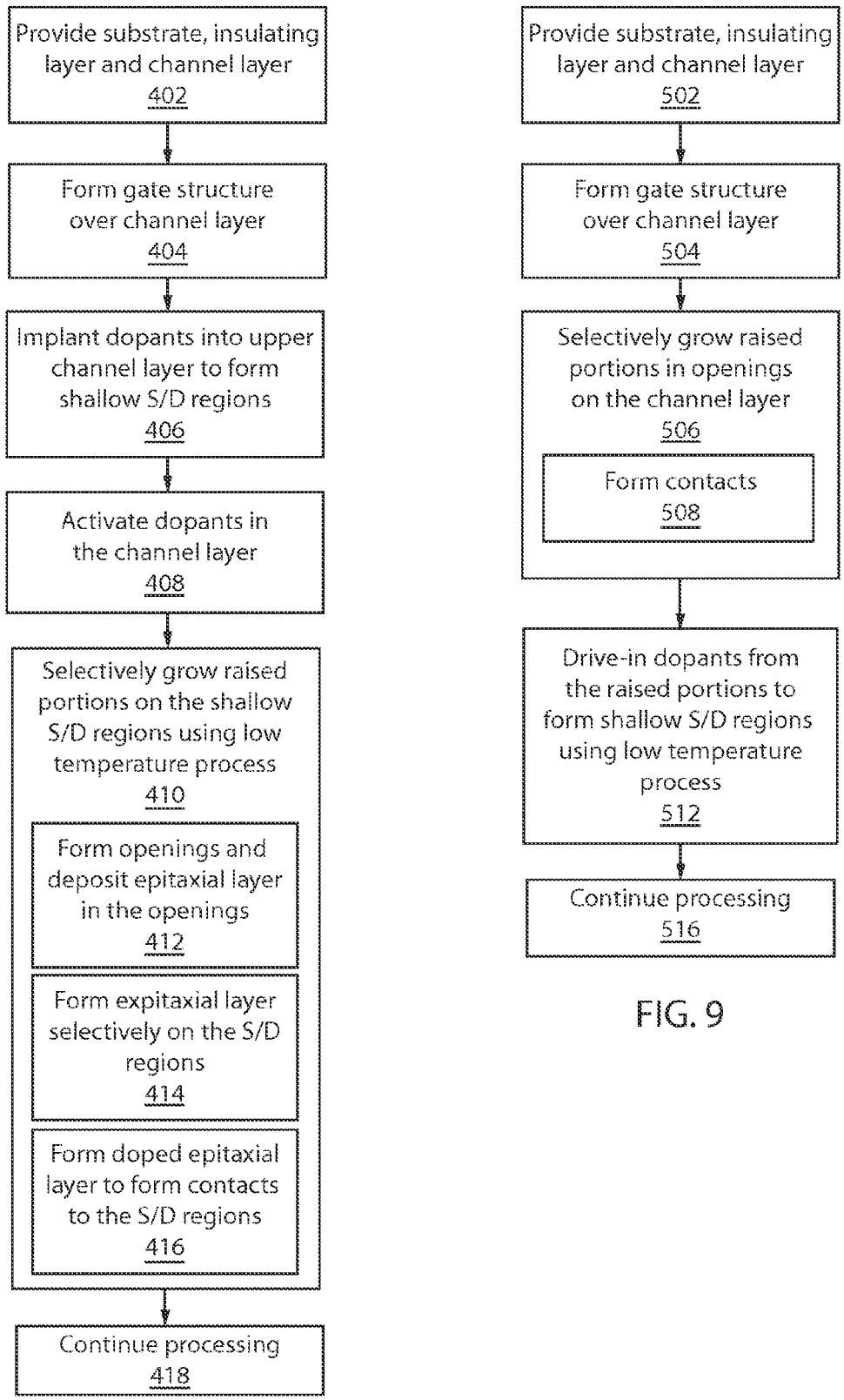

US 9,059,212 B2

BACK-END TRANSISTORS WITH HIGHLY DOPED LOW-TEMPERATURE CONTACTS

RELATED APPLICATION INFORMATION

This application is related to co-pending application U.S. patent application Ser. No. 13/032,866 filed on Feb. 23, 2011, incorporated herein by reference in its entirety.

BACKGROUND

1. Technical Field

The present invention relates to semiconductor fabrication and semiconductor devices, and more particularly to selectively grown raised regions for forming contacts and/or source/drain regions at low temperature.

2. Description of the Related Art

Selective epitaxial growth (SEG) of highly doped silicon is suitable for applications where raised source/drain (S/D) regions are employed for transistors to reduce the parasitic series resistance associated with shallow-doped S/D regions. However, the conventional methods for SEG of silicon require high temperature processing greater than 600 degrees C., and the use of ultra-pure chlorinated silane gases. The high temperature requirement limits the processes and applications which can utilize the conventional methods for SEG of Si.

SUMMARY

A back end of line device and method for fabricating a transistor device include a substrate having an insulating layer formed thereon and a channel layer formed on the insulating layer. A gate structure is formed on the channel layer. Dopants are implanted into an upper portion of the channel layer on opposite sides of the gate structure to form shallow source and drain regions using a low temperature implantation process. An epitaxial layer is selectively grown on the shallow source and drain regions to form raised regions above the channel layer and against the gate structure using a low temperature plasma enhanced chemical vapor deposition process, wherein low temperature is less than about 400 degrees Celsius.

Another method for fabricating a transistor device includes providing a substrate having an insulating layer formed thereon and a channel layer formed on the insulating layer; forming a gate structure on the channel layer; growing a doped epitaxial layer selectively onto exposed portions of the channel layer adjacent to the gate structure using a low temperature plasma enhanced chemical vapor deposition process, wherein low temperature is less than about 400 degrees Celsius; and driving the dopants into an upper portion of the channel layer below the epitaxial layer on opposite sides of the gate structure to form shallow source and drain regions using a low temperature anneal process.

Yet another method for fabricating a transistor device includes providing a substrate having an insulating layer formed thereon and a channel layer formed on the insulating layer; forming a gate structure on the channel layer; removing portions of the channel layer and the insulating layer to form openings to expose the substrate; forming a seed layer in the substrate in the openings; and growing an epitaxial layer selectively on the seed layer in the openings to form raised regions connecting to the channel layer and against the gate structure using a low temperature plasma enhance chemical vapor deposition process, wherein low temperature is less than about 400 degrees Celsius.

A back end of line (BEOL) transistor device includes a substrate having an insulating layer formed thereon and a channel layer on the insulating layer. A gate structure is formed on the channel layer, and shallow source and drain regions are formed in an upper portion of the channel layer on opposite sides of the gate structure. An epitaxial layer is selectively grown on the shallow source and drain regions to form raised regions above the channel layer and against the gate structure. The shallow source and drain regions and the raised regions include a low temperature morphology resulting from low temperature processing to conserve thermal budget wherein low temperature is less than about 400 degrees Celsius.

Another back end of line (BEOL) transistor device includes a substrate having an insulating layer formed thereon and a channel layer on the insulating layer, a gate structure formed on the channel layer and a seed layer formed in the substrate in openings through the channel layer and the insulation layer. An epitaxial layer is selectively grown on the seed layer in the openings to form raised regions connecting to the channel layer and against the gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 8 is a block/flow diagram showing an illustrative method for selective epitaxial growth using implantation and activation of dopants in a channel layer in accordance with the present principles;

FIG. 9 is a block/flow diagram showing an illustrative method for selective epitaxial growth using a channel layer and forming shallow source and drain regions by diffusing dopants from raised regions in accordance with the present principles.

DETAILED DESCRIPTION OF PREFERRED EMBODIMENTS

Figure 1:
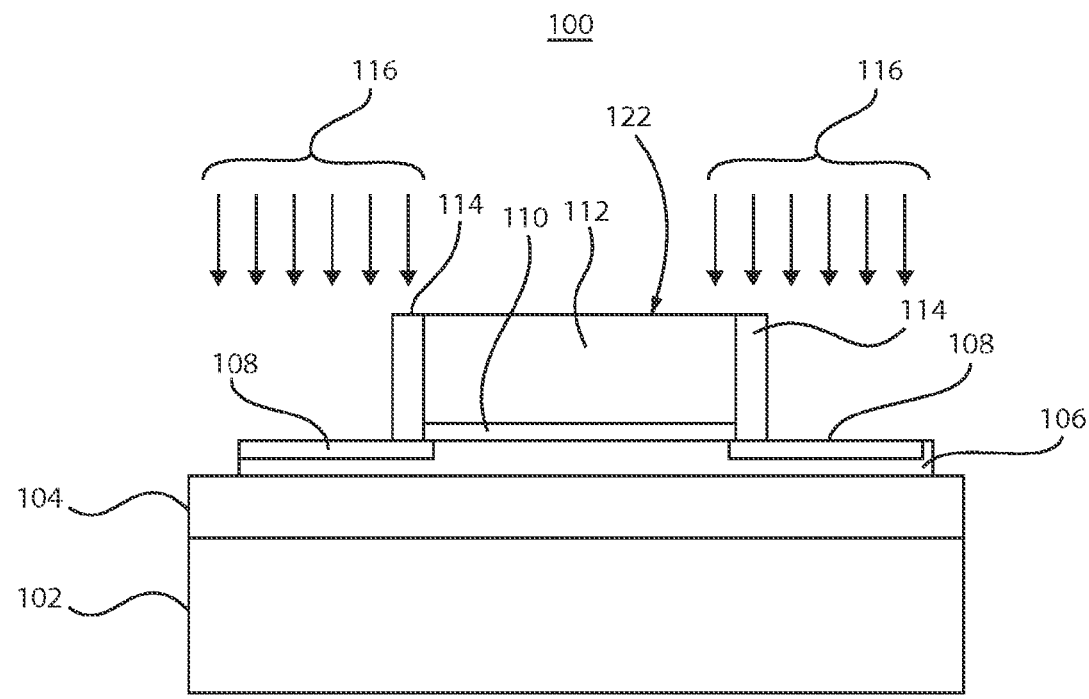
FIG. 1 is a cross-sectional view of an illustrative semiconductor device with shallow source/drain regions formed with implantation and activation in accordance with one embodiment.

In accordance with the present principles, a low temperature process is provided for selective epitaxial growth (SEG), which enables the possibility of forming raised source/drain (S/D) for transistors fabricated in back-end-of-the-line (BEOL) where the processing temperature is limited to below 400 degrees C. (low temperature). In one embodiment, a plasma enhanced chemical vapor deposition (PECVD) is configured to provide: (1) selective growth of Si on predetermined areas, where the semiconductor is exposed and (2) high activation level of dopants in an epi-grown layer. This process provides the selective epitaxial growth of highly-doped layers (e.g., Si) at low temperatures. The highly-doped epi-Si film grown by low temperature PECVD may be employed for raised S/D (RSD) applications for transistors fabricated in the BEOL to reduce parasitic series resistance. The selective epitaxial growth of the film enables the growth of the highly doped Si film within predetermined S/D areas. Other applications are also contemplated. One of the many advantages of the present process includes a low thermal budget which can drastically suppress doping diffusion to maintain the abruptness of junctions (reduce diffusion) among other things.

It is to be understood that the present invention will be described in terms of a given illustrative semiconductor architecture having or integrated on a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaInP, InGaAs or SiGe. These compounds may include different proportions of the elements within the compound, e.g., InGaAs includes $In_x Ga_y As_{1-x-y}$, where x, y are less than or equal to 1, or SiGe includes $Si_x Ge_{1-x}$ where x is less than or equal to 1, etc. In addition, other elements may be included in the compound, such as, e.g., AlInGaAs, and still function in accordance with the present principles. The compounds with additional elements will be referred to herein as alloys.

Referring now to the drawings in which like numerals represent the same or similar elements and initially to FIG. 1, an illustrative transistor structure 100 is shown in accordance with one embodiment. Transistor structure 100 is illustratively depicted as a thin source and drain metal oxide semiconductor field effect transistor (MOSFET), complementary metal oxide semiconductor (CMOS) device, etc. It should be understood that other types of devices/structures may also be employed. The device 100 includes a substrate 102, which may include, e.g., a bulk monocrystalline silicon substrate, a semiconductor-on-insulator (SOI), an extremely thin SOI (ETSOI) substrate, a partially-depleted SOI (PDSOI) substrate or other substrates. Other substrates may include Ge, III-V substrates (e.g., GaAs), etc. It should also be understood that the transistors formed in accordance with the present principles are particularly useful for back-end-of-the-line (BEOL) applications as opposed to front-end of the line (FEOL) processes. As is known, BEOL refers to a second portion of IC fabrication where individual devices (transistors, capacitors, resistors, etc.) get interconnected with wiring on a wafer. BEOL generally begins when a first layer of metal is deposited on the wafer and includes contacts, insulating layers (dielectrics), metal levels, and bonding sites for chip-to-package connections. After a FEOL step there is a wafer with isolated transistors (without any wires). The wafer may include any semiconductor layer of a SOI substrate structure. For example, for BEOL, contacts (pads), interconnect wires, vias and dielectric structures are formed.

The device 100 may be employed in three-dimensional (3D) integration applications or other applications where epitaxial growth is needed to form component layers. In a particularly useful embodiment, the epitaxial growth is employed to form raised source/drain (S/D) regions for transistors. The raised S/D regions described throughout this disclosure may be considered extensions of the S/D regions (e.g., shallow S/D regions) and may be considered contacts to the S/D regions or may be considered both. The present embodiment will illustratively describe forming raised S/D regions although the present principles apply to any epitaxial growth and etching applications.

An insulation layer 104 is formed on the substrate 102 and may include a plurality of materials, combinations of materials, multiple layers, etc. Insulation layer 104 may include an oxide (e.g., $SiO_2$), a nitride (e.g., SiN, SiON, etc.), a silicate glass, etc. A channel layer 106 may be bonded to the insulation layer 104 by a wafer bonding process or the like. Channel layer 106 is a semiconductor layer and may include a single-crystalline (transferred and bonded in the BEOL) or provided in a semiconductor-on-insulator (SOI) substrate) or formed from poly-crystalline material deposited on the insulation layer 104. In one embodiment, the channel layer 106 may include a thickness of between about 2 nm to about 2 microns. The channel layer 106 may be added onto the insulating layer 104 (e.g., BEOL insulating layer).

A gate structure 122 is formed including a gate insulator 110 (e.g., an oxide), a gate conductor 112 (e.g., doped polysilicon or a metal, such as Cu, or other suitable conductor), and spacers 114 (e.g., nitride). Other gate structures and materials may also be employed.

Source and drain (S/D) regions 108 are formed in the channel layer 106 by a low temperature implantation process. A junction depth of the S/D regions 108 may range from about 2 nm to about 50 nm. The low temperature implantation is employed to reduce the thermal budget. The implantation is preferably performed at less than about 150 degrees C., although higher temperatures may be employed (e.g., up to about 400 degrees C.) followed by a low temperature activation step below about 400 degrees C. The implantation may include p-type or n-type ions/dopants 116 depending on the type of device 100 being fabricated. The implantation and activation forms the S/D regions 108 and prepares the surfaces of regions 108 for epitaxial growth.

Raised S/D (RSD) regions 120 (FIG. 2) are formed by epitaxial growth. The epitaxial growth may include a highly doped or undoped silicon at temperatures as low as 150 degrees C. on predetermined areas of the substrate 102. The predetermined areas are designated by the formation of the S/D regions 108. The shape and the location of the regions 108 maps out where selective growth will occur as described with respect to FIG. 2.

Figure 2:
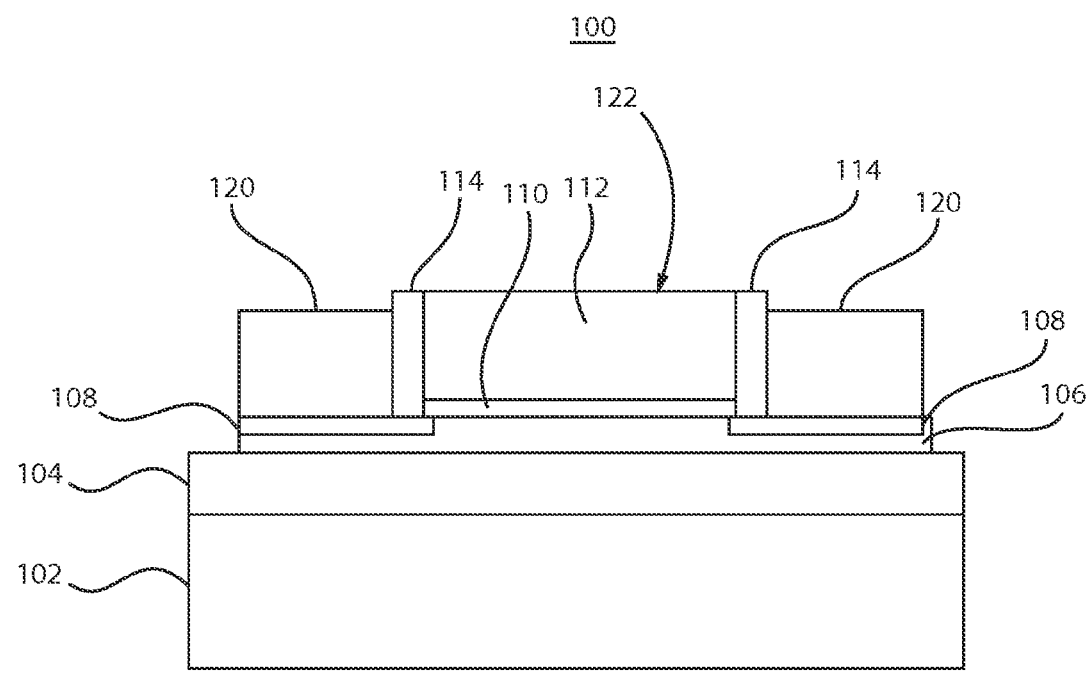
FIG. 2 is a cross-sectional view of the illustrative semiconductor device of FIG. 1 with raised source/drain regions selectively grown on the shallow source/drain regions by a low temperature epitaxial process in accordance with one embodiment.

Referring to FIG. 2, raised S/D (RSD) regions 120 are grown from the regions 108 of the channel layer 106 by selective epitaxial growth. The implantation and activation of the regions 108 promotes selective epitaxial growth of Si, SiGe, SiC and their alloys and combinations. The epitaxial Si layer may include germanium and/or carbon. The RSD regions 120 may be grown from Ge, III-V materials and Si. Selective growth is achieved from the implanted and activated regions 108.

In one embodiment, the selective epitaxial growth of silicon is performed in a hydrogen diluted silane environment using a plasma enhanced chemical vapor deposition process (PECVD) or heavily doped PECVD (HD-PECVD). The gas ratio of hydrogen gas to silane gas ($[H_2]/[SiH_4]$) at 150 degrees C. is preferably between 0 to about 1000. In particularly useful embodiments, epitaxially growth of silicon begins at a gas ratio of about 5-10. The epitaxial Si quality is improved by increasing the hydrogen dilution, e.g., to 5 or greater.

Epitaxial silicon can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces were produced (epitaxial silicon to crystalline silicon) and fewer stacking faults and other defects were observed.

Radio-frequency (RF) or direct current (DC) plasma enhanced chemical vapor deposition (CVD) may be employed preferably at deposition temperature ranges from about room temperature to about 500 degrees C., and preferably from about 150 degrees C. to about 250 degrees C. Plasma power density may range from about 2 $mW/cm^2$ to about 2000 $mW/cm^2$. A deposition pressure range may be from about 10 mTorr to about 5 Torr. The amount of dilution gas depends on the deposition temperature. At low growth temperature of ~150 degrees C., the hydrogen content in the film may be between about $10^{18}$ about $10^{21}$ atoms/$cm^3$. Higher deposition temperatures will result in lower hydrogen incorporation.

In one embodiment, high dopant activation can be obtained at temperatures as low as 150 degrees C. This makes the present methods attractive for applications in 3D integration and raised S/D fabrications, especially for BEOL. The epitaxial Si may contain, e.g., carbon, germanium, phosphorus, arsenic, boron, etc. The low-temperature epitaxial Si may be grown on different substrates, such as Si, Ge, and III-Vs.

Figure 3:
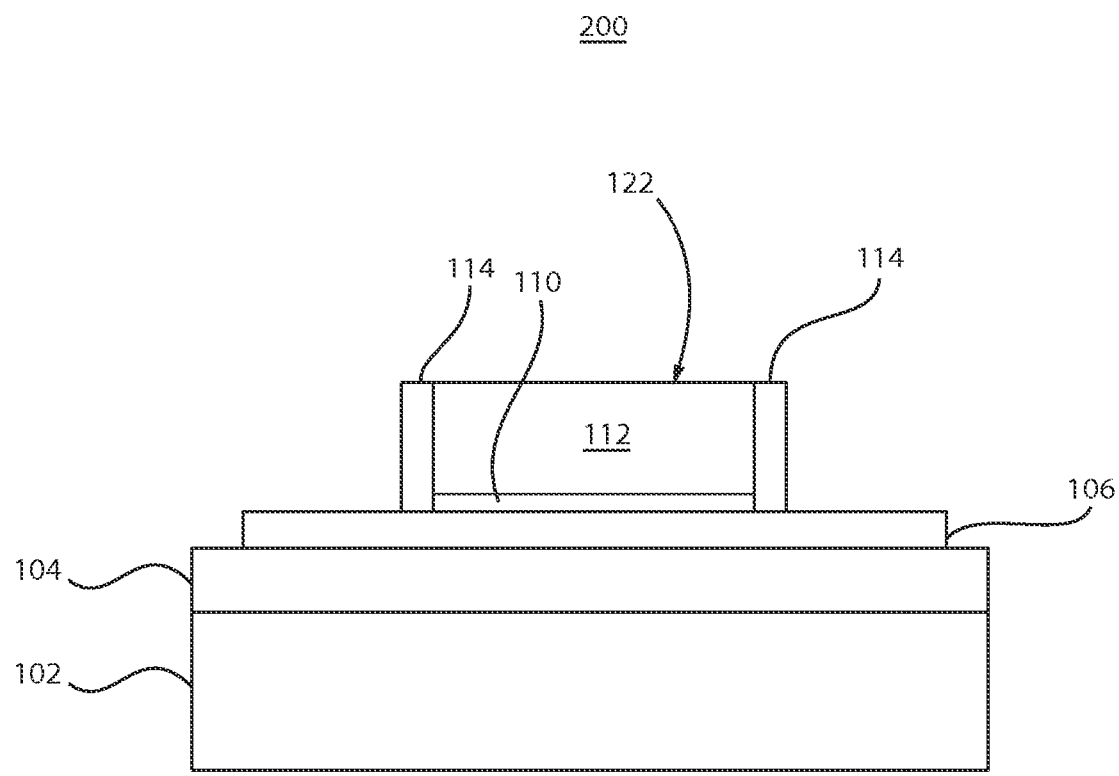
FIG. 3 is a cross-sectional view of another illustrative semiconductor device with a channel layer exposed in accordance with one embodiment.

Referring to FIG. 3, an illustrative transistor structure 200 is shown in accordance with another embodiment. Transistor structure 200 is illustratively depicted as a thin source and drain metal oxide semiconductor field effect transistor (MOSFET), complementary metal oxide semiconductor (CMOS) device, etc. It should be understood that other types of devices/structures may also be employed. The device 200 includes substrate 102, which may include, e.g., a bulk monocrystalline silicon substrate, a semiconductor-on-insulator (SOI), an extremely thin SOI (ETSOI) substrate, a partially-depleted SOI (PDSOI) substrate or other substrates. Other substrates may include Ge, III-V substrates (e.g., GaAs), etc. The device 200 may be employed in the same applications and manner as device 100.

Insulation layer 104 is formed on the substrate 102. Channel layer 106 is a semiconductor layer and may include a single-crystalline (transferred and bonded in the BEOL) or provided in a semiconductor-on-insulator (SOI) substrate) or formed from poly-crystalline material deposited on the insulation layer 104. Gate structure 122 is formed including gate insulator 110 (e.g., an oxide), gate conductor 112 (e.g., doped polysilicon or a metal, such as Cu, or other suitable conductor), and spacers 114 (e.g., nitride). Other gate structures and materials may also be employed.

In this embodiment, S/D regions (108, FIG. 2), are not formed by implantation and activation as in the embodiment of FIGS. 1 and 2. Instead, openings 202 are formed in a dielectric layer 204 to permit selective deposition of raised S/D regions as will be described with respect to FIG. 4.

Figure 4:
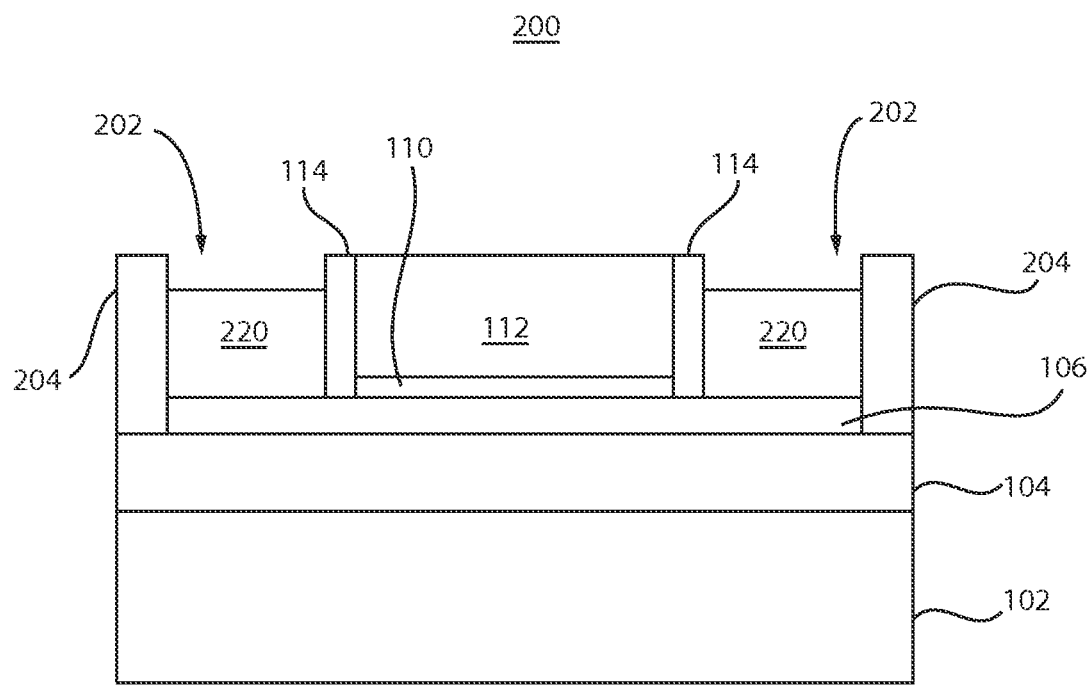
FIG. 4 is a cross-sectional view of the illustrative semiconductor device of FIG. 3 with raised source/drain regions selectively grown on the shallow source/drain regions by a low temperature epitaxial process in accordance with one embodiment.

Referring to FIG. 4, raised S/D (RSD) regions 220 are grown on exposed regions of the channel layer 106 in openings (202, FIG. 3) by selective epitaxial growth. An epitaxial layer forming RSD regions 220 may include germanium and/or carbon. The RSD regions 220 may be grown from Ge, III-V materials and Si (channel layer 106).

In one embodiment, the selective epitaxial growth of silicon is performed in a hydrogen diluted silane environment using a PECVD or HD-PECVD. The epitaxial growth may be performed in accordance with one or more of the embodiments described with respect to FIGS. 1 and 2. The RSD regions 220 are preferably highly doped having a dopant concentration of between about $1\times10^{18}/cm^3$ to about $1\times10^{21}/cm^3$. The epitaxial Si may contain, e.g., carbon, germanium, phosphorus, arsenic, boron, etc. The low-temperature epitaxial Si may be grown on different substrates, such as Si, Ge, and III-Vs.

Figure 5:
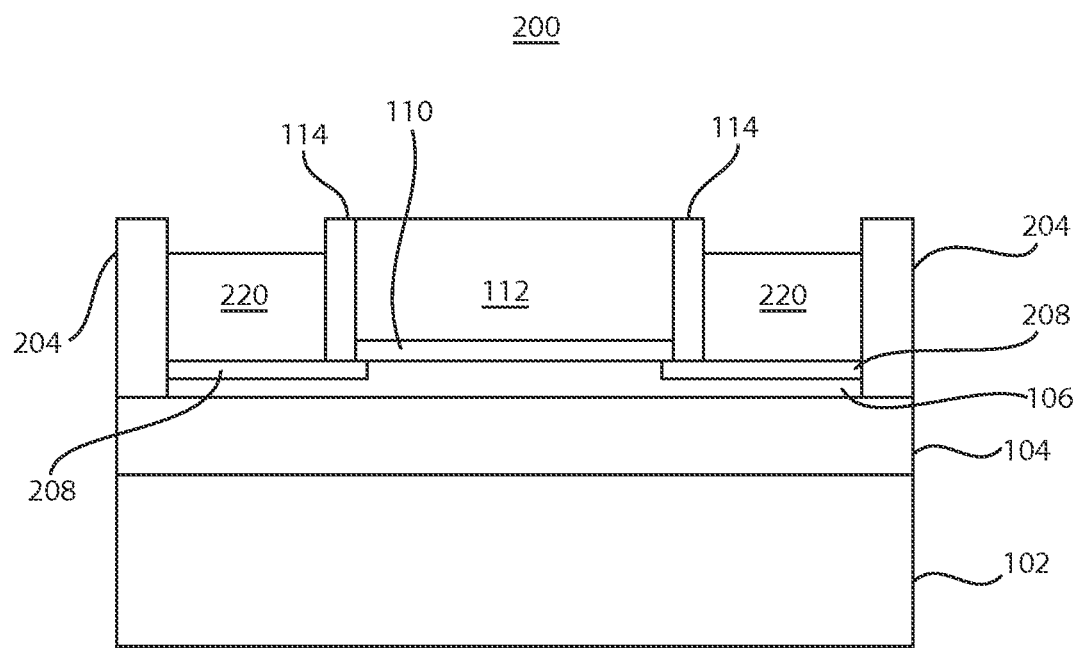
FIG. 5 is a cross-sectional view of the illustrative semiconductor device of FIG. 4 with the raised source/drain regions being annealed to diffuse dopants into the channel layer to form the shallow source/drain regions by a low temperature anneal in accordance with one embodiment.

Referring to FIG. 5, shallow S/D regions 208 are formed in the channel layer 106 below the RSD regions 220 by performing an anneal process. The anneal process drives dopants from the RSD regions 220 into the channel layer 106 preferably at low temperatures, e.g., less than about 400 degrees C. Lower temperatures may be employed as well for longer duration. The highly doped the RSD regions 220 transfer dopants into the channel layer 106 to form the shallow S/D regions 208 which improve transistor operation of the device 200. After the formation of the shallow S/D regions 208, the dielectric layer 204 may be removed and replaced with other dielectric layers and/or structures in accordance with the type of device and application.

Figure 6:
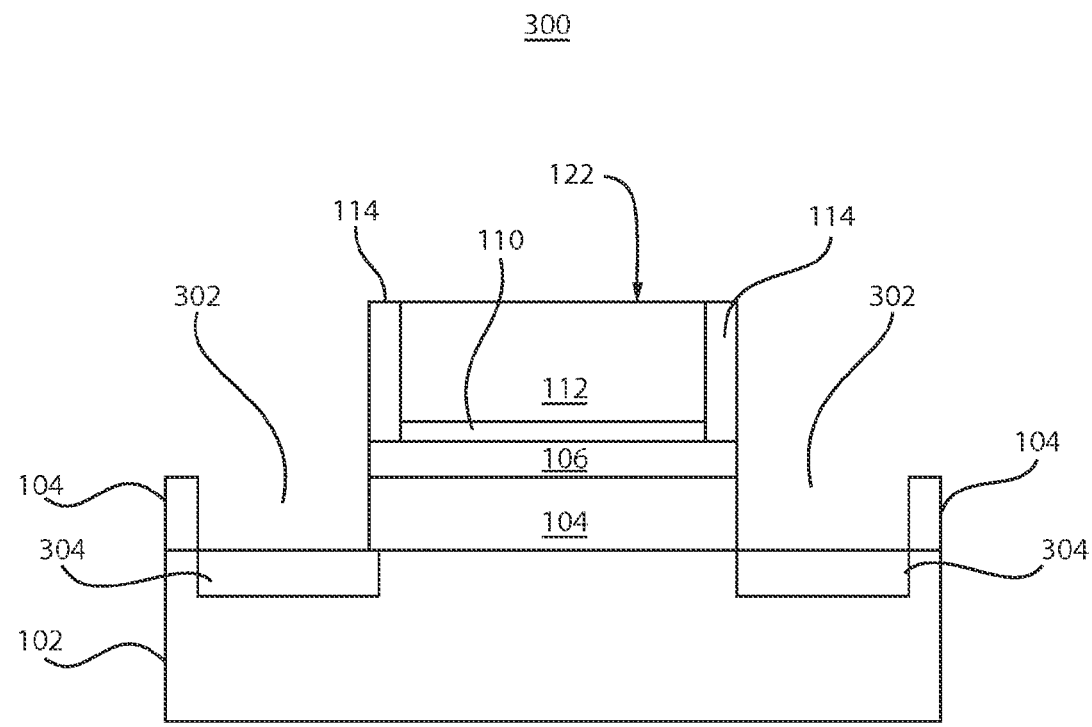
FIG. 6 is a cross-sectional view of yet another illustrative semiconductor device with a seed layer formed in openings which expose the substrate in accordance with one embodiment.

Referring to FIG. 6, in this embodiment, S/D regions (108, FIG. 2), are not formed by implantation and activation as in the embodiment of FIGS. 1 and 2. Instead, openings 302 are formed in the insulation layer 104 to permit selective deposition of raised S/D regions as will be described. The openings 302 may be formed using lithographic processing to form an etch mask which includes exposed portions of the insulation layer 104 where openings are to be formed. The openings 302 are formed using a reactive ion etch (RIE) or other anisotropic etching process that removes the insulation layer 104 to expose the substrate 102 in predetermined areas.

Figure 7:
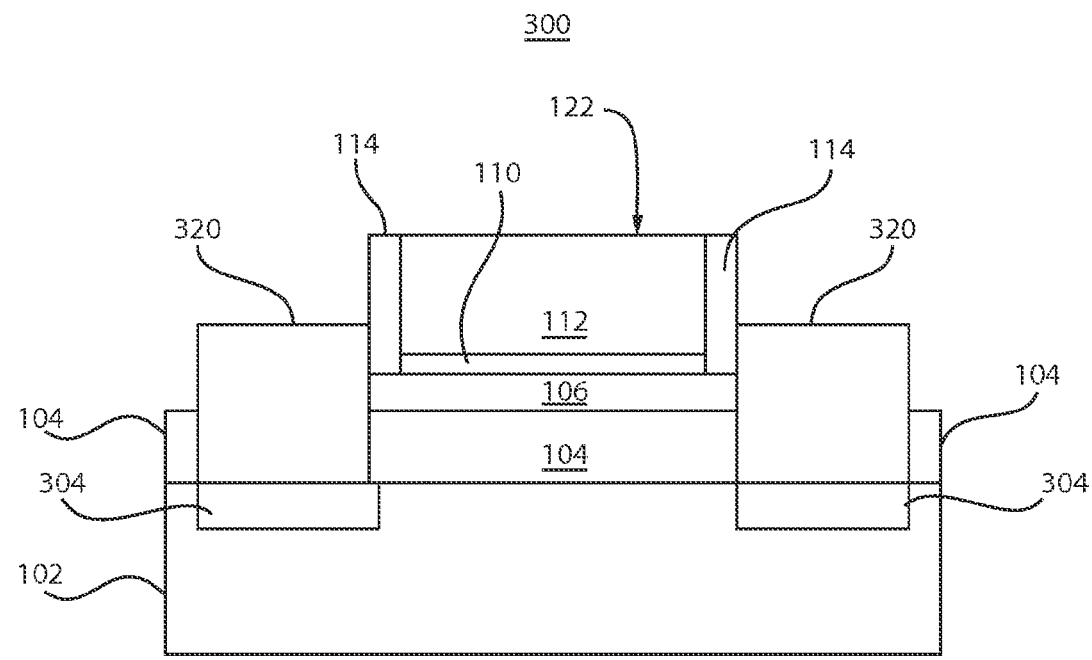
FIG. 7 is a cross-sectional view of the illustrative semiconductor device of FIG. 6 with raised source/drain regions selectively grown in accordance with one embodiment.

While the substrate 102 may be employed as exposed to selectively grow RSD regions 320 (FIG. 7), a seed layer 304 may be formed to enhance selectivity for growing the RSD regions 320 (FIG. 7). In this embodiment, the substrate 102 is preferably a single-crystalline substrate. The seed layer(s) 304 may be formed by doping regions in the substrate 102 corresponding to the openings 302. The doping may occur using an implantation and activation process similar to that described with respect to FIGS. 1 and 2. The implantation and activation processes are preferably low temperature processes below 400 degrees C. and more preferably below 200 degrees C. and as low as about 150 degrees C.

RSD regions 320 are grown from the seed layer 304 (or simply from the substrate 102) by selective epitaxial growth. The implantation and activation of the seed layer 304 promotes selective epitaxial growth of Si, SiGe, SiC and their alloys and combinations. In one embodiment, the seed layer 304 is part of a main substrate or wafer on which the circuit elements were formed during front-end of the line process (prior to back-end of the line process). The epitaxial Si layer may include germanium and/or carbon. The RSD regions 320 may be grown from Ge, III-V materials and Si. Selective growth is achieved from the implanted and activated seed regions 304.

In one embodiment, the selective epitaxial growth of silicon is performed in a hydrogen diluted silane environment using a plasma enhanced chemical vapor deposition process (PECVD) or heavily doped PECVD (HD-PECVD). The gas ratio of hydrogen gas to silane gas ($[H_2]/[SiH_4]$) at 150 degrees C. is preferably between 0 to about 1000. In particularly useful embodiments, epitaxial growth of silicon begins at a gas ratio of about 5-10. The epitaxial Si quality is improved by increasing the hydrogen dilution, e.g., to 5 or greater.

Epitaxial silicon can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces were produced (epitaxial silicon to crystalline silicon) and fewer stacking faults and other defects were observed.

RF or DC PECVD may be employed preferably at deposition temperature ranges from about room temperature to about 500 degrees C., and preferably from about 150 degrees C. to about 250 degrees C. Plasma power density may range from about 2 mW/cm$^2$ to about 2000 mW/cm$^2$. A deposition pressure range may be from about 10 mTorr to about 5 Torr.

As show in FIG. 7, the RSD regions 320 grow to a height of the channel layer 106 and come in contact with the channel layer 106 along end portions of the channel layers below the gate structure 122. The channel layer 106 and the RSD regions 320 form "H" shapes in the embodiment shown. It is preferably that the materials selected for the RSD regions 320 and the channel layer 106 are compatible so that when the channel is conducting, the charge is not inhibited by the channel layer to RSD region interface.

The low temperature RSD regions 120, 220, 320 may include a single-crystalline polycrystalline, microcrystalline or nanocrystalline structure or form. Depending on the application, the RSD regions 120, 220, 320 may be doped in-situ (during the formation process) or by employing an implantation process after formation. RSD regions 120, 220, 320 formed from a silicon base material may include germanium carbon, hydrogen, deuterium and may also be doped with boron, phosphorus, arsenic, etc.

RSD regions 120, 220, 320 formed by low temperature PECVD in accordance with the present principles provide low thermal budget manufacture for BEOL processes. One advantage includes drastic suppression of doping diffusion to already formed structures. In this way, already formed structures, such as the channel layer, shallow source/drain regions, etc. maintain their well-defined morphology (diffusion is reduced) which reduces parasitic series resistance, among other things.

Figure 10:
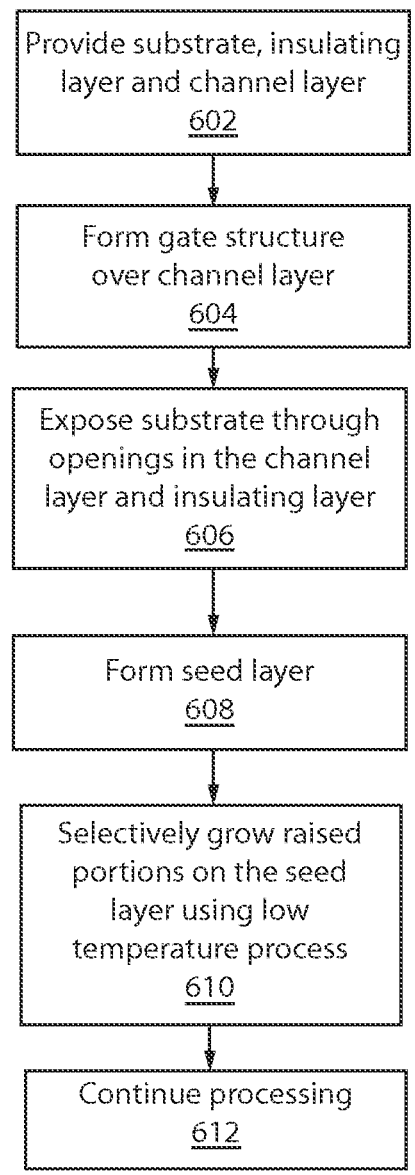
FIG. 10 is a block/flow diagram showing another illustrative method for selective epitaxial growth seed layers in accordance with the present principles.

With respect to FIGS. 8, 9 and 10, it should be noted that, in some alternative implementations, the functions noted in the blocks may occur out of the order noted. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Referring to FIG. 8, methods for fabricating a transistor device are described and shown in accordance with illustrative embodiments. In block 402, a substrate is provided having an insulating layer formed thereon and a channel layer formed on the insulating layer. The channel layer may be added by wafer bonding to the insulating layer, preferably a BEOL insulating layer. In block 404, a gate structure is formed on the channel layer. The channel layer may include a crystalline form of one of Si, Ge and a III-V material, and the crystalline form of the channel layer may include single-crystalline and/or polycrystalline material.

In block 406, dopants are implanted into an upper portion of the channel layer on opposite sides of the gate structure to form shallow source and drain regions using a low temperature implantation process. In block 408, the dopants are activated using a low temperature activation process.

In block 410, an epitaxial layer is selectively grown on the shallow source and drain regions to form raised regions above the channel layer and against the gate structure using a low temperature plasma enhance chemical vapor deposition process. The low temperature is less than about 400 degrees Celsius. The low temperature plasma enhanced chemical vapor deposition process may include using a dilution gas and a source gas with a gas ratio of dilution gas to source gas of between 0 to about 1000 at about 150 degrees C. In one embodiment, raised source and drain regions are formed above the channel layer at a temperature of between about 150 to about 250 degrees Celsius.

In block 412, growing the epitaxial layer may include forming openings in a dielectric layer and depositing the epitaxial layer on the shallow source and drain regions. In block 414, growing the epitaxial layer may include depositing the epitaxial layer selective to the shallow source and drain regions instead of other portions of the channel layer. In block 416, growing the epitaxial layer may include growing a doped epitaxial layer on sides of the gate structure to form contacts to the shallow source and drain regions. In block 418, processing continues to complete the device.

Referring to FIG. 9, another method for fabricating a transistor device is described and shown. In block 502, a substrate is provided having an insulating layer formed thereon and a channel layer formed on the insulating layer. In block 504, a gate structure is formed on the channel layer. The channel layer may include a crystalline form of one of Si, Ge and a III-V material, and the crystalline form of the channel layer may include single-crystalline and/or polycrystalline material.

In block 506, a doped epitaxial layer is selectively grown onto exposed portions of the channel layer adjacent to the gate structure using a low temperature plasma enhance chemical vapor deposition process, wherein low temperature is less than about 400 degrees Celsius.

In block 508, openings may be formed in a dielectric layer and formed over the channel layer. The epitaxial layer is deposited in the openings for the selective deposition. In block 510, the doped epitaxial layer may be grown on sides of the gate structure to form contacts to the shallow source and drain regions. The doped epitaxial layer may be grown to form raised source/drain regions.

In block 512, the dopants are driven (diffused) into an upper portion of the channel layer below the epitaxial layer on opposite sides of the gate structure to form shallow source and drain regions using a low temperature anneal process. In block 514, processing continues to complete the device.

Referring to FIG. 10, yet another method for fabricating a transistor device is described and shown. In block 602, a substrate is provided having an insulating layer formed thereon and a channel layer formed on the insulating layer. In block 604, a gate structure is formed on the channel layer. The channel layer may include a crystalline form of one of Si, Ge and a III-V material, and the crystalline form of the channel layer may include single-crystalline and/or polycrystalline material.

In block 606, portions of the channel layer and the insulating layer are removed to form openings to expose the substrate. In block 608, a seed layer is formed in the substrate in the openings. The seed layer may include the surface of the main substrate (e.g., wafer) on which the circuit elements are formed prior to BEOL, e.g. FEOL devices. The seed layer may include a doped portion of the substrate exposed in the openings. An activation process may be employed (at low temperature).

In block 610, an epitaxial layer is selectively grown on the seed layer in the openings to form raised regions connecting to the channel layer and formed against the gate structure using a low temperature plasma enhance chemical vapor deposition process. The epitaxial layer may be formed on sides of the gate structure to form contacts or source and drain regions. The low temperature is less than about 400 degrees Celsius. The low temperature plasma enhanced chemical vapor deposition process includes a dilution gas and a source gas with a gas ratio of dilution gas to source gas of between 0 to about 1000 at about 150 degrees C. In block 612, processing continues to complete the device.

Having described preferred embodiments for back-end transistors with highly doped low-temperature contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a transistor device, comprising:
providing a substrate having an insulating layer formed thereon and a channel layer formed on the insulating layer;
forming a gate structure on the channel layer;
implanting dopants into an upper portion of the channel layer on opposite sides of the gate structure to form shallow source and drain regions using a low temperature implantation process, wherein the shallow source and drain regions do not extend to the insulating layer; and
growing an epitaxial layer selectively on the shallow source and drain regions to form raised regions above the channel layer against the gate structure using a low temperature plasma enhanced chemical vapor deposition process, wherein low temperature is less than about 400 degrees Celsius.

2. The method as recited in claim 1, wherein the channel layer includes a crystalline form of one of Si, Ge and a III-V material and wherein the crystalline form of the channel layer is single-crystalline or polycrystalline.

3. The method as recited in claim 1, further comprising activating the dopants using a low temperature activation process.

4. The method as recited in claim 1, wherein growing an epitaxial layer selectively on the shallow source and drain regions includes forming openings in a dielectric layer and depositing the epitaxial layer on the shallow source and drain regions.

5. The method as recited in claim 1, wherein growing an epitaxial layer selectively on the shallow source and drain regions includes depositing the epitaxial layer selective to the shallow source and drain regions instead of other portions of the channel layer.

6. The method as recited in claim 1, wherein growing an epitaxial layer selectively on the shallow source and drain regions includes growing a doped epitaxial layer on sides of the gate structure to form contacts to the shallow source and drain regions.

7. The method as recited in claim 1, wherein the low temperature plasma enhanced chemical vapor deposition process includes a dilution gas and a source gas with a gas ratio of dilution gas to source gas of between 0 to about 1000 at about 150 degrees C.

8. The method as recited in claim 1, wherein growing an epitaxial layer selectively on the shallow source and drain regions to form raised regions includes forming raised source and drain regions above the channel layer at a temperature of between about 150 to about 250 degrees Celsius.

9. The method as recited in claim 1, wherein the transistor is a back-end-of-line (BEOL) transistor formed on the insulating layer, which is a BEOL insulating layer.

* * * * *